United States Patent [19]
Tanoue et al.

[11] Patent Number: 5,942,001
[45] Date of Patent: Aug. 24, 1999

[54] INFORMATION PROCESSING APPARATUS

[75] Inventors: Koki Tanoue, Yokohama; Hideki Takahashi, Nagareyama; Tomohisa Yoshimaru, Yokohama, all of Japan

[73] Assignee: Kabushiki Kaisha Toshiba, Kawasaki, Japan

[21] Appl. No.: 08/823,235

[22] Filed: Mar. 24, 1997

[30] Foreign Application Priority Data

Mar. 25, 1996 [JP] Japan .................................. 8-068816

[51] Int. Cl.$^6$ .................................................. G06F 11/00
[52] U.S. Cl. ........................ 714/752; 714/765; 714/769; 714/809
[58] Field of Search .............................. 371/37.01, 40.11, 371/40.3, 40.14, 37.05, 55, 56, 57.1; 714/746, 752, 763, 765, 769, 779, 809, 810, 811

[56] References Cited

U.S. PATENT DOCUMENTS

| 3,812,531 | 5/1974 | Hall | 360/26 |
|---|---|---|---|
| 4,633,470 | 12/1986 | Welch et al. | 371/37 |
| 4,760,576 | 7/1988 | Sako | 371/40 |
| 5,216,677 | 6/1993 | Takagi et al. | 371/40.3 |
| 5,373,513 | 12/1994 | Howe et al. | 371/42 |
| 5,451,943 | 9/1995 | Satomura | 341/58 |
| 5,631,457 | 5/1997 | Fukuda et al. | 235/462 |

*Primary Examiner*—Dieu-Minh T. Le
*Attorney, Agent, or Firm*—Pillsbury Madison & Sutro LLP

[57] ABSTRACT

Channel data obtained from a reproduced signal is input to a demodulation ROM as an address and demodulated. In the demodulated channel data, the data whose data pattern is not consistent with a 2–7 modulation method is recognized as an error data. When a resync code, given in the channel data at every 15 bytes is not detected within a predetermined time period, a resync code undetected signal is generated. The demodulated data is arranged in a matrix, and the position of the error data in the matrix and the resync code undetected generation position are specified. An error correction circuit carries out the error correction (erasure correction) by using these positions and an error correction code relating to one direction of a row or a column of the matrix.

9 Claims, 12 Drawing Sheets

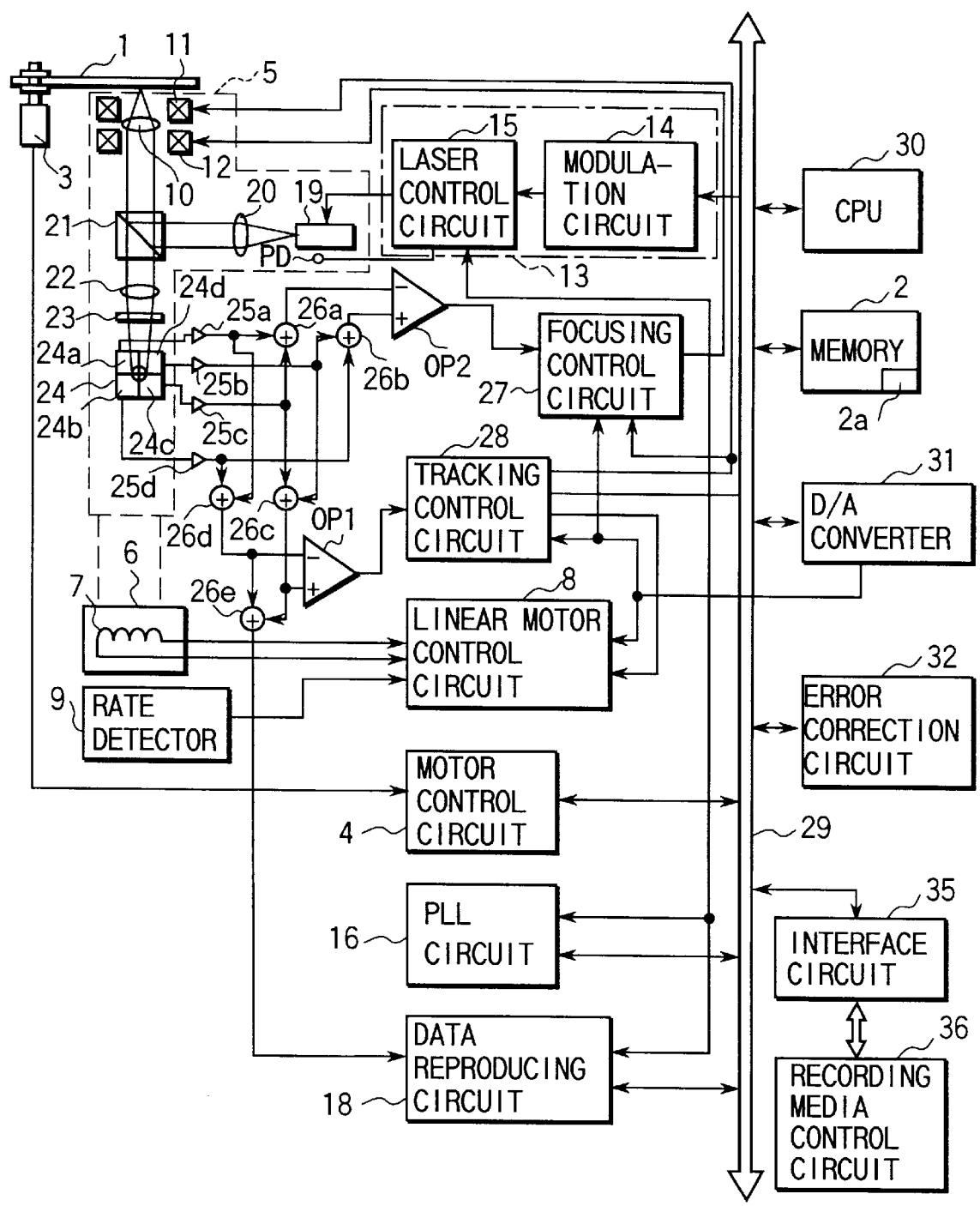
F I G. 1

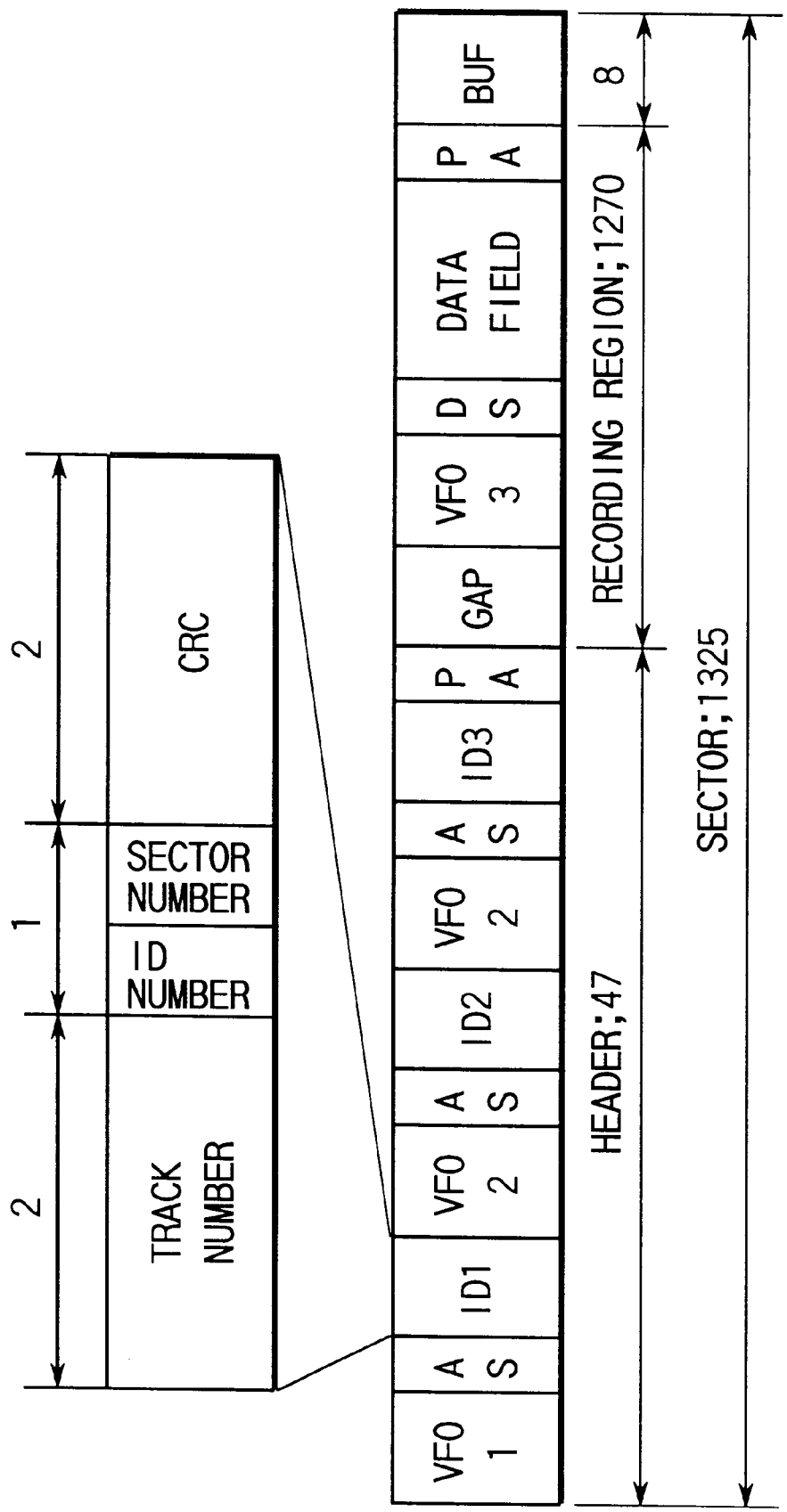
F I G. 2

FIG. 7A (40, 41, 42, 43, 44, 45, 46, 47, 48, 49, 4A, 4B, 4C, 4D, 4E, 4F)

| D7 | D6 | D5 | D4 | D3 | D2 | D1 | D0 |
|----|----|----|----|----|----|----|----|
| 0  | 1  | 0  | 0  | *  | *  | *  | *  |

FIG. 7B (90, 91, 92, 93)

| D7 | D6 | D5 | D4 | D3 | D2 | D1 | D0 |
|----|----|----|----|----|----|----|----|
| 0  | 1  | 0  | 0  | *  | *  | *  | *  |

FIG. 7C (24)

| D7 | D6 | D5 | D4 | D3 | D2 | D1 | D0 |
|----|----|----|----|----|----|----|----|
| 1  | 0  | 0  | 1  | 0  | 0  | *  | *  |

FIG. 7D (80, 81, 82, 83, 84, 85, 86, 87, 88, 89, 8A, 8B, 8C, 8D, 8E, 8F)

| D7 | D6 | D5 | D4 | D3 | D2 | D1 | D0 |
|----|----|----|----|----|----|----|----|
| 0  | 0  | 1  | 0  | 0  | 1  | 0  | 0  |

FIG. 7E (20, 21, 22, 23)

| D7 | D6 | D5 | D4 | D3 | D2 | D1 | D0 |
|----|----|----|----|----|----|----|----|
| 0  | 0  | 1  | 0  | 0  | 0  | *  | *  |

FIG. 7F (08)

| D7 | D6 | D5 | D4 | D3 | D2 | D1 | D0 |
|----|----|----|----|----|----|----|----|
| 0  | 0  | 0  | 0  | 1  | 0  | 0  | 0  |

FIG. 7G (10, 11, 12, 13)

| D7 | D6 | D5 | D4 | D3 | D2 | D1 | D0 |
|----|----|----|----|----|----|----|----|
| 0  | 0  | 0  | 1  | 0  | 0  | *  | *  |

LOW-ORDER 4-BITS

ROM DATA, FOR DEMODULATION (8-BIT INPUT, 8-BIT OUTPUT)

UPPER 4-BITS

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 03 | 03 | 03 | 03 | 34 | 36 | 34 | 36 | 34 | 36 | 34 | 36 | 20 | 22 | 20 | 22 |
| 1 | 01 | 01 | 01 | 01 | 20 | 22 | 20 | 22 | 82 | 82 | 82 | 82 | 03 | 03 | 03 | 03 |
| 2 | 61 | 61 | 61 | 61 | 20 | 22 | 20 | 22 | 82 | 82 | 82 | 82 | 03 | 03 | 03 | 03 |
| 3 | 03 | 03 | 03 | 03 | 03 | 03 | 03 | 03 | 03 | 03 | 03 | 03 | 03 | 03 | 03 | 03 |
| 4 | 82 | 82 | 82 | 82 | 82 | 82 | 82 | 82 | 82 | 82 | 82 | 82 | 82 | 82 | 82 | 82 |
| 5 | 41 | 41 | 41 | 41 | 03 | 03 | 03 | 03 | 03 | 03 | 03 | 03 | 03 | 03 | 03 | 03 |
| 6 | 03 | 03 | 03 | 03 | 03 | 03 | 03 | 03 | 03 | 03 | 03 | 03 | 03 | 03 | 03 | 03 |
| 7 | 03 | 03 | 03 | 03 | 03 | 03 | 03 | 03 | 03 | 03 | 03 | 03 | 03 | 03 | 03 | 03 |
| 8 | C2 | C2 | C2 | C2 | C2 | C2 | C2 | C2 | C2 | C2 | C2 | C2 | C2 | C2 | C2 | C2 |
| 9 | 41 | 41 | 41 | 41 | 03 | 03 | 03 | 03 | 03 | 03 | 03 | 03 | 03 | 03 | 03 | 03 |
| A | 03 | 03 | 03 | 03 | 03 | 03 | 03 | 03 | 03 | 03 | 03 | 03 | 03 | 03 | 03 | 03 |
| B | 03 | 03 | 03 | 03 | 03 | 03 | 03 | 03 | 03 | 03 | 03 | 03 | 03 | 03 | 03 | 03 |
| C | 03 | 03 | 03 | 03 | 03 | 03 | 03 | 03 | 03 | 03 | 03 | 03 | 03 | 03 | 03 | 03 |
| D | 03 | 03 | 03 | 03 | 03 | 03 | 03 | 03 | 03 | 03 | 03 | 03 | 03 | 03 | 03 | 03 |
| E | 03 | 03 | 03 | 03 | 03 | 03 | 03 | 03 | 03 | 03 | 03 | 03 | 03 | 03 | 03 | 03 |
| F | 03 | 03 | 03 | 03 | 03 | 03 | 03 | 03 | 03 | 03 | 03 | 03 | 03 | 03 | 03 | 03 |

SHADING PORTION: ERROR FLAG SIGNAL=1

F I G. 8

| CHANNEL DATA (2-7MODULATED SIGNAL) | USER DATA |
|---|---|
| 0100 | 10 |
| 100100 | 010 |
| 00100100 | 0010 |
| 1000 | 11 |
| 001000 | 011 |
| 00001000 | 0011 |
| 000100 | 000 |

FIG. 9

| ROM OUTPUT LOW-ORDER 2BIT | | WORD LENGTH OF CHANNEL DATA | WORD LENGTH OF USER DATA |
|---|---|---|---|
| D1 | D0 | | |
| 0 | 0 | 8BITS | 4BITS |
| 0 | 1 | 6BITS | 3BITS |
| 1 | 1 | 4BITS | 2BITS |
| 1 | 1 | PROHIBITION | PROHIBITION |

FIG. 10

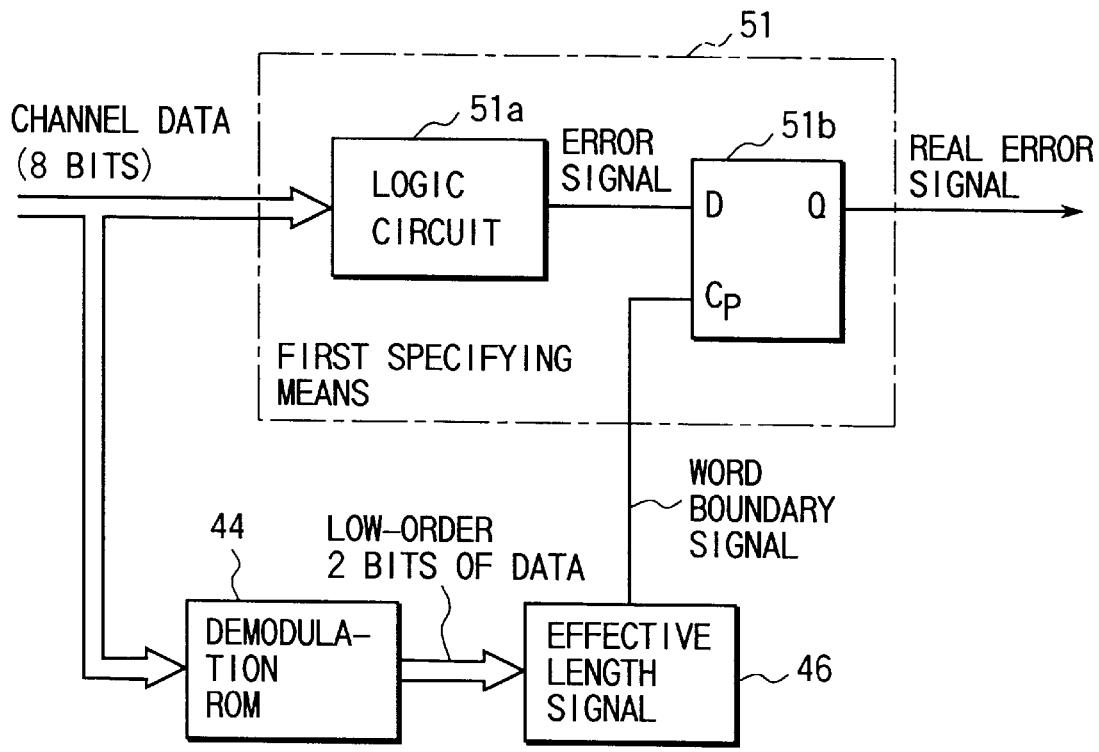
F I G. 1 1
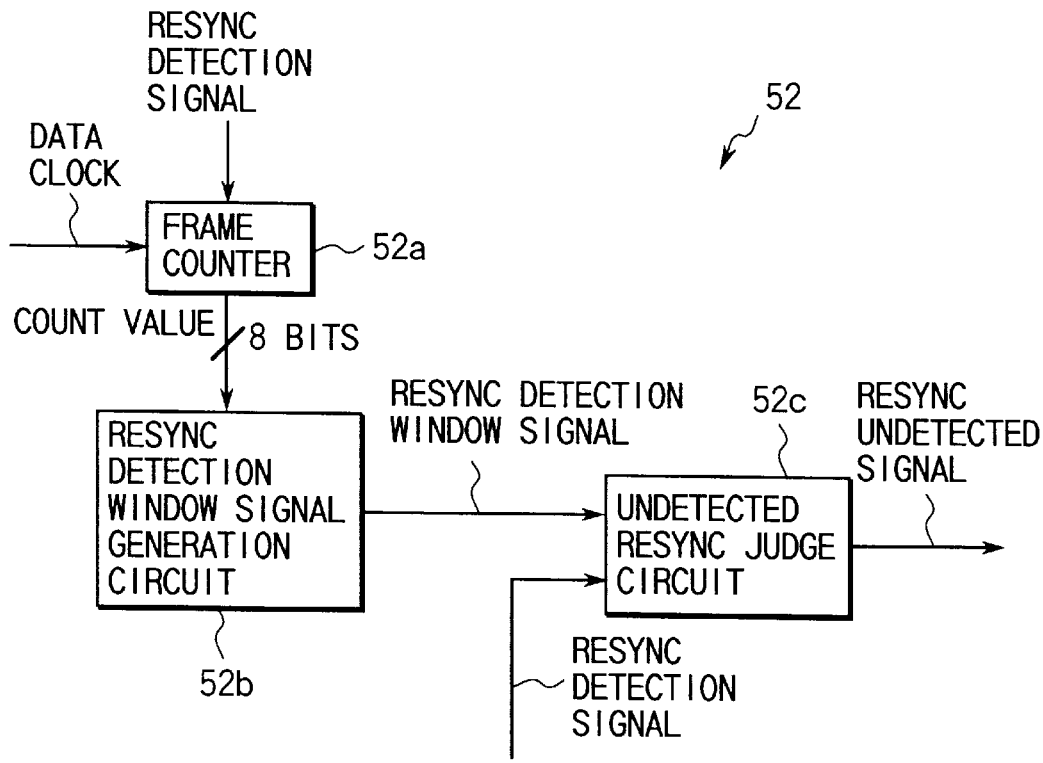
F I G. 1 2

| | | | 0 | 1 | 2 | 3 | 4 |
|---|---|---|---|---|---|---|---|
| DS1 | DS2 | DS3 | 1 | 2 | 3 | 4 | 5 |
| | | | 6 | 7 | 8 | 9 | 10 |
| | | | 11 | 12 | 13 | 14 | 15 |
| | | RS1 | 16 | 17 | 18 | 19 | 20 |
| | | | 21 | 22 | 23 | 24 | 25 |
| | | | 26 | 27 | 28 | 29 | 30 |
| | | RS2 | 31 | 32 | 33 | 34 | 35 |
| | | | ... | ... | ... | ... | ... |
| | | | 501 | 502 | 503 | 504 | 505 |
| | | | 506 | 507 | 508 | 509 | 510 |
| | | RS34 | 511 | 512 | P1.1 | P1.2 | P1.3 |
| | | | P1.4 | CRC1 | CRC2 | CRC3 | CRC4 |
| | | | E1.1 | E2.1 | E3.1 | E4.1 | E5.1 |
| | | RS35 | E1.2 | E2.2 | E3.2 | E4.2 | E5.2 |
| | | | E1.3 | E2.3 | E3.3 | E4.3 | E5.3 |
| | | | E1.4 | E2.4 | E3.4 | E4.4 | E5.4 |
| | | | ... | ... | ... | ... | ... |
| | | RS39 | E1.14 | E2.14 | E3.14 | E4.14 | E5.14 |
| | | | E1.15 | E2.15 | E3.15 | E4.15 | E5.15 |
| | | | E1.16 | E2.16 | E3.16 | E4.16 | E5.16 |
| INTERLEAVE NUMBER | | | 0 | 1 | 2 | 3 | 4 |

DATA (104 BYTES IN A COLUMN)

ECC (16 BYTES IN A COLUMN)

F I G. 1 4

| SECTOR ID 1 | SECTOR 1 | PI PARITY (HORIZONTAL DIRECTION) |
|---|---|---|
| SECTOR ID 2 | SECTOR 2 | PI PARITY (HORIZONTAL DIRECTION) |
| | ⋮ | ⋮ |
| SECTOR ID 16 | SECTOR | PI PARITY (HORIZONTAL DIRECTION) |
| PO PARITY (VERTICAL DIRECTION) | | |

F I G. 1 5

INFORMATION PROCESSING APPARATUS

BACKGROUND OF THE INVENTION

The present invention relates to an information processing apparatus, such as an optical disk apparatus and the like, in which a laser beam is directed toward the optical disk, and variations in the refractive index of a recording film or the like are used to record and reproduce the information.

An analog signal reproduced from the optical disk is converted into a binary signal represented by "1" and "0". This operation is called a binarization. Binarization can be accomplished by the well-known slice level method at the well-known differentiated reproduced signal method.

A binary digital signal is input to a PLL (Phase Locked Loop) circuit, and a data sequence synchronized to a reproduced clock can be obtained. This data sequence is called channel data.

After binarization, the binary signal is passed through the PLL circuit, and channel data comprising "1"s and "0"s are obtained. The obtained channel data is, for example, a 2–7 modulated code sequence. The 2–7 modulation is a kind of RLL (Run Length Limited) code, and since the minimum run is "2" and the maximum run thereof is "7", the modulation is called 2–7 modulation. In general, the term "run" means a series of bits with the same value ("0" or "1") or a continuous bit length, where, without specific notes, it is assumed that the continuous number of "0" bits is called the run.

In 2–7 modulation, the series of "1" bits does not exist, and the continuous number of "0" bits ranges from "2" to "7". The RLL code has a finite maximum inversion distance. Although, the data sequence which a user wants to record in the optical disk via a drive apparatus (henceforth, referred to as user data, and this data is original data before the modulation) may have many "1" bits or "0" bits in a row, 2–7 modulation is carried out. As a result it is possible to obtain a code in which a "1" bit is necessarily generated within a constant period.

Since in the PLL circuit, phases are compared by the timing of a transition from "0" to "1" or from "1" to "0" of the signal after binarization (henceforth, referred to as a binary signal), 2–7 modulation is used. As a result an interval of phase comparison can be necessarily within the constant period. The channel data is input to a demodulator, and the channel data is inverse-converted into the user data.

The data is recorded in the optical disk in a unit called a sector. A size of the sector is, for example, "512B", "1KB", "2KB", or the like. "B" denotes a byte, and in general, one byte is equal to "8" bits. This sector includes, for example, a header portion formed by an embossed pit, user data recorded by emitting the laser beam when the data is recorded, a VFO, a sector number, a synchronous code, a CRC code, an ECC code or the like, and 2–7 modulation is carried out so that, for example, the information is recorded by using a record between marks.

The synchronous code is a particular data sequence in which "1B" is added to user data having "15B (bytes)", a bit shift or the like is corrected by the synchronous code, and transmission of an error is prevented. The CRC code is used for discriminating whether the error exists in the read user data or not, etc., and for example, the CRC code of "4B" is added to user data of "512B".

The ECC code is the code for detecting the error position and for correcting the error, and for example, the ECC code of "80B" is added to user data of "512B". The sector number is recorded in the portion called a pointer region, and for example, sector number data of "4B" is added to user data of "512B". The user data is input to an optical disk drive apparatus from an information input terminal, etc., via an SCSI bus or the like.

The SCSI (Small Computer System Interface) is a peripheral device interface of a small-sized computer, and the SCSI is used for the optical disk drive apparatus, a CD-ROM, a hard disk, an image scanner, or the like. The obtained user data is stored in a DRAM (Dynamic Random Access Memory) or the like by a sector unit.

The user data is interleaved, and a burst error is converted into a random error and a short byte error. For example, when the user data is "512B" per "1" sector, a pointer (4B), the CRC (4B) and the ECC (80B) are added to the user data of "512B". The resultant data of "600B" is arranged in a matrix (120×5). The matrix comprises five columns having "120B", and each column comprises the data of "104B" (either the user data, the pointer, or the CRC) and the ECC code of "16B". As the ECC code, for example, an LDC (Long Distance Code) is used.

The LDC is the code having a long minimum distance and a high correction ability. The LDC is one proposed standardization of the optical disk. In this case, the LDC detects and corrects the error in one column comprising "120B". In case of "non-erasure error", a correction up to "8B" can be carried out.

An erasure error means the error whose position is known, but whose pattern (value) is not known.

If the erasure error can be correctly detected, error correction up to "16B" can be carried out in one column comprising "120B". However, in a conventional technique, the erasure error is not detected, and assuming that the erasure error does not exist, correction has been carried out up to "8B" per one column. In this method, the maximum in "1" sector is correction up to "40B".

As the method of recording in the optical disk at a high density, there are the method of reducing the distance between each pit, reducing the distance between tracks, or the like. More specifically, when the method of reducing the distance between the pits is adopted, that is, when a recording linear density is increased, the distance (along the track) necessary for recording 1B is reduced.

Accordingly, comparing the optical disk having a higher linear density to the optical disk having a lower linear density, even if a scratch and dust on the former disk is the same size as those on the latter disk, there is a difference between each byte number of the error of the disks. Thereby, there is a possibility that the optical disk having the higher linear density is more disadvantageous than the optical disk having the lower linear density in view of the error correction.

In order to solve the above problem, some methods are considered. For example, a method that increases redundancy to enhance the error correction ability has been is considered. The redundancy means a ratio of the byte number all over the sector to a redundant byte number (the ECC, etc.) occupied therein. In this method, since the byte number of the ECC code is increased, the amount of the information to be recorded is increased, and there is a possibility that the effect on the high density record is reduced.

Furthermore, for example, a method using an integrated code, that is, a plurality of correction sequences are used so that the error correction ability is enhanced is also considered. When using the integrated code, an error correction code is added to each of a plurality of vertical and horizontal sequences by interleaving, and the error correction code is multiplexed. As a result, a code having a higher error correction ability can be constructed.

FIG. 15 is an ECC block diagram showing an example of a data structure using the above integrated code type correction sequence. An ECC block 55 comprises an integrated code structure in which an inner code parity PI in a horizontal direction for correcting a data error is added to an outer parity PO in a vertical direction. The ECC block 55 comprises a plurality of sectors, and sectors ID1 to IDn as address data are provided to each sector. In this method, it takes a long time to correct the data error, and sometimes, there is occurred a problem relating to data transfer rate when the information is reproduced.

SUMMARY OF THE INVENTION

The present invention is made in consideration of the above problems. It is an object of the present invention to provide an information processing apparatus which can enhance an error correction ability without losing an effect of a high density record, further without extending a time necessary for the correction.

In order to achieve the above object, according to one aspect of the present invention, an information processing apparatus reading an information recorded in an information storage media includes a converter which extracts a reproduced signal including a data and an error code from the information storage media and converts the reproduced signal into a plurality of data sequences having a predetermined length, a comparator which judges whether a data pattern of the data sequences converted by the converter is included in a plurality of previously determined data patterns or not, and if not, which judges the data sequence as an error data sequence, data organizer which arranges a predetermined number of data sequences converted by the converter in a matrix and specifies a position in the matrix of the error data sequence judged by the comparator, and an error corrector which corrects the error data sequence in the data sequences arranged in the matrix by using the position of the error data sequence and the error code.

According to another aspect of the present invention, an information processing apparatus reading an information recorded in an information storage media includes a converter which extracts a reproduced signal including data, an error code, and a resync code set at a predetermined distance and converts the reproduced signal into a plurality of data sequences having a predetermined length, a demodulator which demodulates the data sequences converted by the converter in accordance with a predetermined rule, first comparator which judges whether the data sequences converted by the converter is an applicable data sequence to the predetermined rule or an inapplicable error data, a second comparator which judges whether the resync code is included in the data sequences converted by the converter at the predetermined distance or not, and if not, which informs a resync code undetected position in the plurality of data sequences having the predetermined length, a data organizer which arranges the predetermined number of data sequences demodulated by the demodulator in a matrix comprising rows and columns, a third comparator which judges an error sequence in which all the data are estimated as an error value in the columns of the matrix by using the position in the matrix of the data sequence judged to be an error data by the first comparator and a resync code undetected generation position judged by the second comparator and which sets an error flag relative to the error sequence, and error corrector which estimates all the data included in the error sequence where the error flag is set by the third comparator as the error value and which corrects the error in the direction of the row of the matrix by using the error code.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing an optical disk apparatus;

FIG. 2 shows a sector format of an optical disk;

FIGS. 7A to 7G show effective address data of a demodulation ROM;

FIG. 8 shows ROM output data relative to an input address in the demodulation ROM;

FIG. 9 shows user data relative to a channel data;

FIG. 10 shows channel data length and user data length relative to low-order 2 bits of the ROM output data;

FIG. 11 schematically shows the first data organizer;

FIG. 12 schematically shows the second data organizer;

FIG. 14 shows data and each error correction code arranged in a matrix in a memory; and FIG. 15 shows a construction of an integrated code type ECC block.

DETAILED DESCRIPTION OF THE INVENTION

Figure 3:
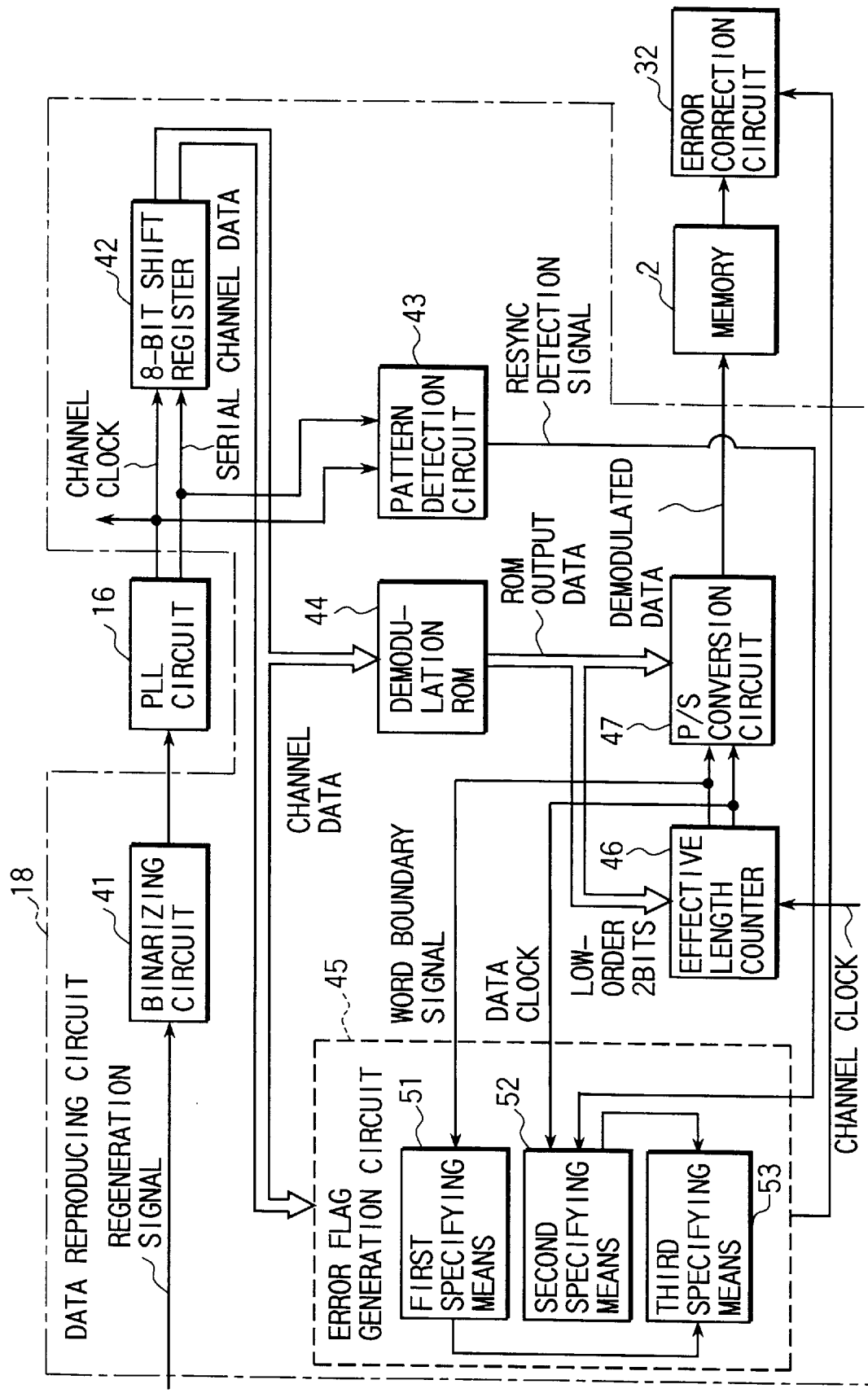
FIG. 3 is a block diagram showing a principal portion of a data reproducing circuit in the optical disk according to an embodiment of the present invention.

In FIG. 1, an optical disk 1 which is a disc-shaped information storage media, is rotated by a motor 3, for example, at a constant velocity. The motor 3 is controlled by a motor control circuit 4. Recording and reproducing information relative to the optical disk 1 is carried out by an optical head 5. The optical head 5 is attached to a drive coil 7 which is a moving portion of a linear motor 6. The drive coil 7 is connected to a linear motor control circuit 8.

The linear motor control circuit 8 is connected to a rate detector 9. A rate signal of the optical head 5, detected by the rate detector 9, is transmitted to the linear motor control circuit 8. A permanent magnet (not shown) is disposed on a fixed portion of the linear motor 6. The drive coil 7 is excited by the linear motor control circuit 8. As a result the optical head 5 is moved in the radial direction of the optical disk 1.

An objective lens 10, supported by a wire or a plate spring (not shown), is disposed on the optical head 5. The objective lens 10 moves in the focusing direction (in the direction of an optical axis of the lens) by a drive coil 11. Furthermore, the objective lens 10 can be moved in the tracking direction (in the direction transverse to the optical axis of the lens) by driving a drive coil 12.

By a drive control of a laser control circuit 13, a laser beam is emitted from a semiconductor laser oscillator 19. The laser control circuit 13 includes a modulation circuit 14 and a drive circuit 15. The laser control circuit 13 is synchronized to a clock signal for recording provided from a PLL circuit 16, and is operated. In the modulation circuit 14, recording data provided from an error correction circuit 32 is modulated to an appropriate signal for recording, that is, to 2–7 modulated data. The laser drive circuit 15 drives the semiconductor laser oscillator (or an argon neon laser oscillator) 19 corresponding to the 2–7 modulated data from the modulation circuit 14.

During recording, the PLL circuit 16 divides a reference clock signal oscillated from a crystal oscillator into a frequency corresponding to a recording position on the optical disk 1. Thereby, the clock signal for recording is generated. During reproduction, a clock signal for reproducing is generated corresponding to a reproduced synchronous code. Furthermore, an abnormal frequency of the clock signal for reproducing is detected. The detection of the abnormal frequency is carried out according to whether or not the frequency of the clock signal for reproducing exists within range of a predetermined frequency corresponding to the recording position on the optical disk 1. Furthermore, the PLL circuit 16 selectively outputs the clock signal for recording or reproducing corresponding to a control signal from a CPU 30 and the signal from a binary circuit 41 of a data reproducing circuit 18.

The laser beam emitted from the semiconductor laser oscillator 19 is radiated onto the optical disk 1 via a collimator lens 20, a half prism 21, and the objective lens 10. A reflected laser beam from the optical disk 1 is transmitted to an optical detector 24 via the objective lens 10, the half prism 21, a condenser lens 22, and a cylindrical lens 23.

The optical detector 24 comprises four-divided optical detection cells 24a, 24b, 24c, and 24d. Among the optical detection cells, an output signal from the optical detection cell 24a is provided to one end of an adder 26a via an amplifier 25a. The output signal from the optical detection cell 24b is provided to one end of an adder 26b via an amplifier 25b. The output signal from the optical detection cell 24c is provided to the other end of an adder 26a via an amplifier 25c. The output signal from the optical detection cell 24d is provided to the other end of the adder 26b via an amplifier 25d.

Furthermore, the output signal from the optical detection cell 24a is provided to one end of an adder 26c via the amplifier 25a. The output signal from the optical detection cell 24b is provided to one end of an adder 26d via the amplifier 25b. The output signal from the optical detection cell 24c is provided to the other end of the adder 26d via the amplifier 25c. The output signal from the optical detection cell 24d is provided to the other end of the adder 26c via an amplifier 25d.

The output signal from the adder 26a is provided to an inverting input terminal of a differential amplifier OP2, and the output signal from the adder 26b is provided to a non-inverting input terminal of the differential amplifier OP2. The differential amplifier OP2 outputs the signal relating to a focus point corresponding to a difference between both of the output signals from the adders 26a and 26b. The output is provided to a focusing control circuit 27. The output signal from the focusing control circuit 27 is provided to the focusing drive coil 12. Thereby, the laser beams are controlled so that the laser beam is always in focus on the optical disk 1.

The output signal from the adder 26c is provided to an inveting input terminal of a differential amplifier OP1, and the output signal from the adder 26d is provided to a non-inversion input terminal of the differential amplifier OP1. The differential amplifier OP1 outputs a track differential signal corresponding to the difference between both of the output signals from the adders 26c and 26d. The output is provided to a tracking control circuit 28. The tracking control circuit 28 forms a track drive signal corresponding to the track differential signal from the differential amplifier OP1.

The track drive signal output from the tracking control circuit 28 is provided to the drive coil 11 in the tracking direction. Furthermore, the track differential signal used in the track drive circuit 28 is provided to the linear motor drive circuit 8.

By carrying out the above focusing and tracking, a reflectance variation from a pit (recorded information) formed on the track is reflected in a combined signal from the output signals from each optical detection cell 24a, 24b, 24c and 24d of the optical detector 24, that is, the output signal from an adder 26e is the sum of both of the output signals from the adders 26c and 26d. The signal is provided to the data reproducing circuit 18. The data reproducing circuit 18 reproduces recorded data according to the clock signal for reproducing from the PLL circuit 16.

Furthermore, the data reproducing circuit 18 detects a sector mark in preformatted data according to the output signal from the adder 26e and the clock signal for reproducing from the PLL circuit 16. Moreover, the data reproducing circuit 18 reproduces a track number and a sector number as an address information from the binary signal according to the binary signal from the PLL circuit 16 and the clock signal for reproducing.

The reproduced data from the data reproducing circuit 18 is provided to the error correction circuit 32 via a bus 29. The error correction circuit 32 corrects the error by using an error correction code (ECC) in the reproduced data, or the error correction circuit 32 gives the error correction code (ECC) to the recorded data provided from an interface circuit 35, and outputs the recorded data to a memory 2.

The reproduced data whose error is corrected in the error correction circuit 32 is provided to a storage media control apparatus 36 as an external device via the bus 29 and the interface circuit 35. The recorded data from the storage media control apparatus 36 is provided to the error correction circuit 32 via the interface circuit 35 and the bus 29.

When the objective lens 10 is moved by the tracking control circuit 28, the linear motor 6, that is, the optical head 5 is moved by the linear motor control circuit 8 so that the objective lens 10 is located near the center portion in the optical head 5.

A D/A converter 31 is used for sending/receiving the information between the focusing control circuit 27, the tracking control circuit 28, the linear motor control circuit 8, and a CPU 30 controlling all over the optical disk apparatus.

The motor control circuit 4, the linear motor control circuit 8, the laser control circuit I5, the PLL circuit 16, the data reproducing circuit 18, the focusing control circuit 27, the tracking control circuit 28, the error correction circuit 32, and the like are controlled by the CPU 30 via the bus 29. The CPU 30 carries out a predetermined operation by using a program recorded in the memory 2.

FIG. 2 shows an example of a sector format in the optical disk 1. FIG. 2 shows the case in which user data per one sector is "512B". Numerals in FIG. 2 denote a (data) byte number. As explained above, the term "byte" denotes a user byte number, and it corresponds to 16 bits of a channel bit after the modulation.

A VFO (Variable Frequency Oscillator) is a region for drawing the PLL in which a continuation of "0101. . ." is recorded for "12" bytes (corresponding to 192 bits of the channel bit).

AS is an abbreviation for an Address Sync is a synchronous code having "1" byte showing where an sector address starts. Sometimes, the AS is also called an AM (Address Mark). The pattern thereof is "0100100000000100", and a particular pattern which does not appear in the data portion is used.

ID 1 (Identifier) to ID3 are the regions showing "5"-byte address information. The "5" bytes include a "3"-byte sector address (including ID number) and "2"-byte CRC.

The sector address is "24" user bits which equals "3" bytes resulting from adding a bit before modulation, that is, adding address data having "22" user bits to the ID number having "2" user bits.

For example, in case of ID1, the ID number is the number "1" written three times. Since any one of values "1" to "3" can be obtained, "2" bits are necessary.

The CRC (Cylic Redundancy Check) is the error correction code relative to the "3"-byte sector address (including the ID number), and it has "2" bytes. The CRC can detect whether the error exists in a read ID ("5" bytes) or not.

In a VFO2, similarly to the VFO1, the same pattern for locking the PLL is recorded for "8" bytes.

A PA (Postambles) is the region having "1" byte or "6" bytes, and it is located in ID3 or after the data portion. When the data is converted into 2–7 modulated code, which is a variable word length modulation method, the PA is the region disposed in such a manner that a break-point of the word is necessarily lastly generated. A GAP (Gap) does not exist in this region, where any length of "16" to "32" channel bits is taken at random.

A VF03 is also the region for locking the PLL, and furthermore, it is an object of this region to insert the synchronous code into the same pattern and to synchronize to a byte boundary.

A DS (Data Sync) is also called DM (Data Mark). It is the synchronous code for synchronizing the byte boundary for the following data portion.

A DATA FIELD is called the data portion, and it comprises the user data, the resync code, the error correction code (ECC), CRC, the pointer region, and the like. These data are arranged in the RAM in a matrix in a predetermined order. After these data are 2–7 modulated, they are recorded in the optical disk 1.

A BUF (Buffer) is the region for absorbing a variation of a disk rotation, where nothing is recorded.

Figure 4:
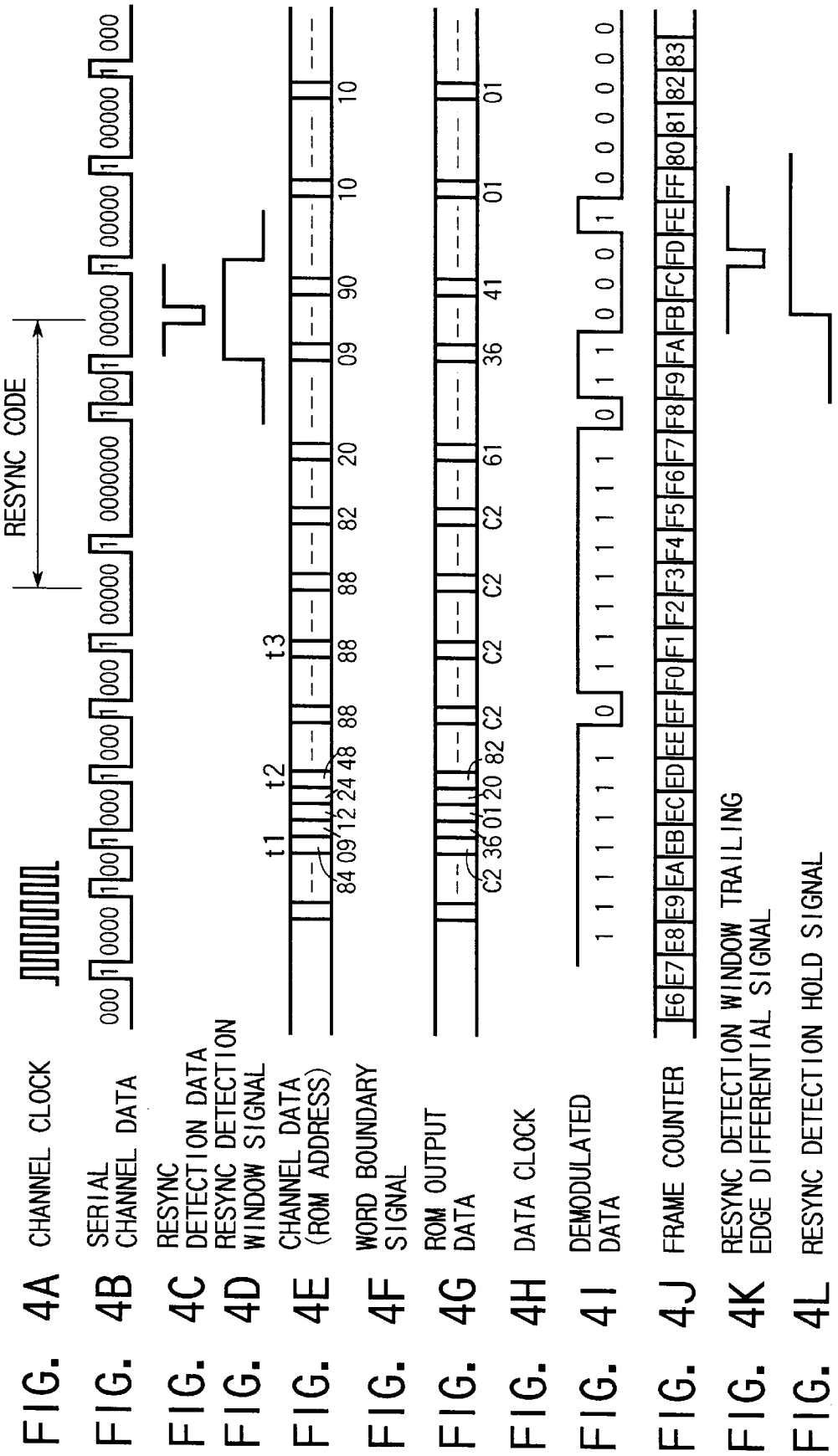
FIGS. 4A to 4L show a signal waveform of the principal portion in the data reproducing circuit.
Figure 5:
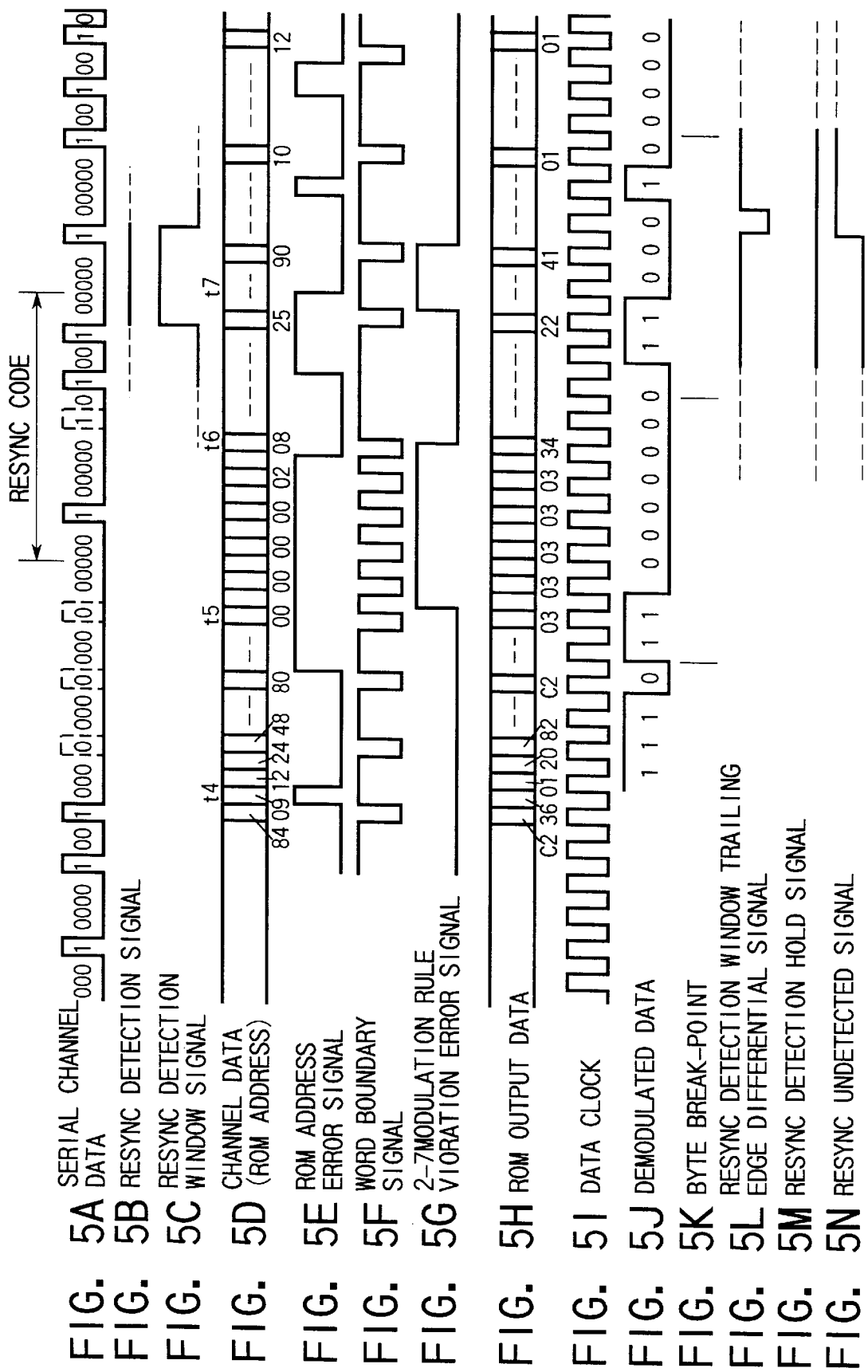
FIGS. 5A to 5N show another signal waveform of the principal portion in the data reproducing circuit.

According to the information processing apparatus having the above construction, an optical disk apparatus, the principal portion is mounted on the data reproducing circuit 18. FIG. 3 shows this principal portion. FIGS. 4 and 5 each show a signal waveform of each portion of the data reproducing circuit 18 shown in FIG. 3. Operation of the data reproducing circuit 18 will be explained in detail below with reference to FIGS. 4 and 5.

As shown in FIG. 3, the binary circuit 41 inputs the signal reproduced by optical disk means reproducer, and the input signal is binarized according to a constant threshold level TH. The output signal from the binary circuit 41 is provided to the PLL circuit 16, and is converted into a data sequence (channel clock) synchronized to the clock signal for reproducing an optical disk reproduction signal.

The channel clock and channel data output from the PLL circuit 16 are shown in FIGS. 4A and 4B. The channel clock and channel data are provided to a shift register 42 and a pattern detection circuit 43 having an "8"-bit structure.

The shift register 42 converts the provided channel data into 8-bit parallel data, and the shift register 42 outputs the converted data. The 8-bit channel data is provided to a demodulation ROM 44 and an error flag generation circuit 45 as the address data (see FIG. 4E).

The pattern detection circuit 43 detects 16-bit resync code "0010000000100100", which is a synchronous signal, by using the channel data from the shift register 42.

Figure 6:
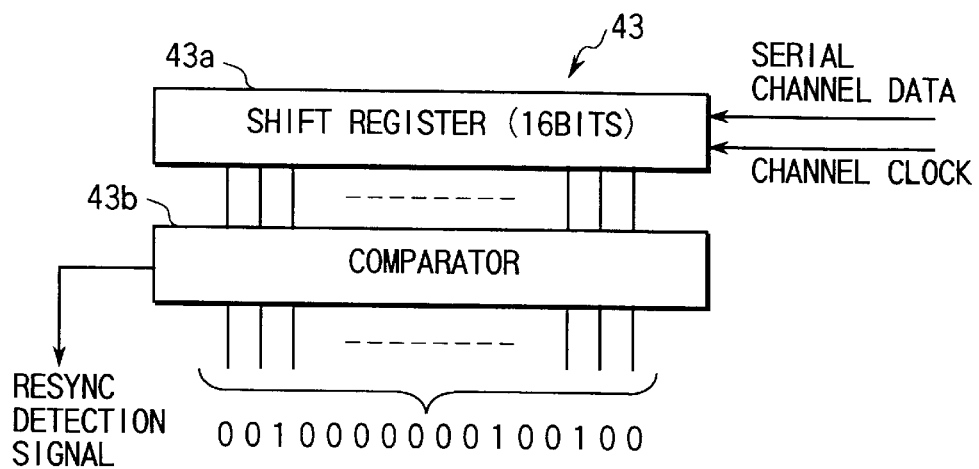
FIG. 6 is a schematic diagram of a resync pattern detection circuit.

As shown in FIG. 6, the pattern detection circuit 43 comprises a shift register 43a and a comparator 43b having 16-bit construction.

The channel clock and channel data as the output signal from the PLL circuit 16 are provided to the shift register 43a. The 26-bit channel data is output to the comparator 43b. The comparator 43b compares the 16-bit channel data from the shift register 43a to the resync code "0010000000100100", and when the 16-bit channel data corresponds to the resync code, a resync detection signal shown in FIG. 4C is output. The resync detection signal is provided to second data organizer 52 in the error flag generation circuit 45.

The demodulation ROM 44 outputs the data stored in a ROM address corresponding to the 8-bit channel data (address data) from the shift register 42 shown in FIG. 4E as a ROM output data shown in FIG. 4G. The ROM output data is the data modulated according to, for example, a predetermined "2–7 modulation rule" corresponding to the address data. The ROM data includes the data showing a block length and a bit length of the user data. The ROM output data is provided to an effective length counter 46 and a P/S (Parallel/Serial) conversion circuit 47.

By using the effective length counter 46, the word boundary of a variable length block code by a 2–7 code modulation is known. That is, low-order 2 bits of the 8-bit ROM output data from the demodulation ROM 44 are used in order to judge whether the channel data length as the 2–7 modulated signal is 4 bits, 6 bits, or 8 bits, as shown in FIG. 9. A word boundary signal shown in FIG. 4F is output. The word boundary signal is provided to the P/S (Parallel/Serial) conversion circuit 47 and a first data organizer 51 in the error flag generation circuit 45.

The channel clock from the effective length counter 46 or the PLL circuit 16 is divided into two frequencies, thereby the data clock shown in FIG. 4H is output. The data clock is provided to the P/S (Parallel/Serial) conversion circuit 47 and the second data organizer 52 in the error flag generation circuit 45.

The error flag generation circuit 45 comprises the first data organizer 51, the second data organizer 52 and third data organizer 53.

The first data organizer 51 checks whether the 8-bit channel data from the shift register 42 is the channel bit sequence corresponding to the 2–7 modulated signal or not. If the 8-bit channel data is a different bit sequence (2–7 modulation rule violation), the error signal shown in FIG. 5E is output. The error signal relative to the 2–7 modulation rule violation is output to the third data organizer 53.

As shown in FIG. 11, the first data organizer 51 comprises a logic circuit 51a and a D-shaped flip-flop 51b. When the 8-bit channel data from the shift register 42 exists in the address except for the channel bit sequence corresponding to the 2–7 modulated signal (in the address not accessed, if normal), the logic circuit 51a outputs the error signal (ROM address error signal) shown in FIG. 5E. For example, when the address corresponding to a shaded portion (shown by slant lines) in ROM data for demodulation in FIG. 8 is provided, "1" is output as the error signal. When the address corresponding to a non-shaded portion is provided, "0" is output.

The error signal from the logic circuit 51a is provided to a data input terminal D of the flip-flop 51b. Furthermore, the word boundary signal from the effective length counter 46 is provided to a clock pulse input terminal Cp of the flip-flop 51b. When the error signal from the logic circuit 51a is provided to the flip-flop 51b, if the word boundary signal from the effective length counter 46 is provided, the flip-flop 51b outputs the error signal (2–7 modulation rule violation error signal) shown in FIG. 5G is output to the third data organizer 53.

For example, as shown by a dotted line in FIG. 5A, when a serial channel data is input by mistake, the first data organizer 51 outputs the error signal, as shown in FIG. 5G.

The second data organizer 52 detects whether the resync code is provided at a predetermined time period (15 bytes) or not by using the resync detection signal from the pattern detection circuit 43 and the data clock from the effective length counter 46. When the resync code is not provided at a predetermined time period, a resync undetected signal is output to the third data organizer 53.

As shown in FIG. 12, the second data organizer 52 comprises a frame counter 52a, a resync detection window signal generation circuit 52b, and a undetected resync judge circuit 52c.

The frame counter 52a is set to a predetermined count number (80 h) (that is, an initial value=80 h) by the resync detection signal from the pattern detection circuit 43. As shown in FIG. 4J, whenever the data clock is provided, the frame counter 52a is incremented, and the count value is output to the resync detection window signal generation circuit 52b.

While the count value from the frame counter 52a is a predetermined value (PA to FCh), the resync detection window signal generation circuit 52b generates the resync detection window signal shown in FIG. 5C, and the signal is output to the undetected resync judge circuit 52c.

While the resync detection window signal from the resync detection window signal generation circuit 52b is provided, if the resync detection signal from the pattern detection circuit 43 is not provided, the undetected resync judge circuit 52c outputs the resync undetected signal.

For example, the undetected resync judge circuit 52c has the circuit for holding the resync detection signal for a predetermined period such as the signal shown in FIG. 4L, and the circuit for differentiating a trailing edge of the resync detection window signal, such as the signal shown in FIG. 4K. In the trailing edge of the resync detection window signal, if the resync detection signal is not held, the resync undetected signal is output to the third data organizer 53.

The data for every 5 bytes is defined as one digit corresponding to the error signal relative to the 2–7 modulation rule violation from the first data organizer 51 and the resync undetected signal from the second data organizer 52. The third data organizer 53 outputs the error flag relative to every digit to the error correction circuit 32.

The P/S (Parallel/Serial) conversion circuit 47 serially outputs the data at high-order 2 to 4 bits of the ROM output data from the demodulation ROM 44 as a demodulated data shown in FIG. 5J corresponding to the word boundary signal and the data clock from the effective length counter 46. In this case, the break-point of the byte of the demodulated data is shown in FIG. 5K.

Next, the operation of the data reproducing circuit according to an embodiment of the present invention will be explained in detail.

The reproduced signal output from the adder 26e is binarized in the binary circuit 41. The and the binary signal is provided to the PLL circuit 16. The PLL circuit 16 outputs the channel clock shown in FIG. 4A and the serial channel data synchronized to the clock shown in FIG. 4B from the binary signal. The channel clock and the serial channel data from the PLL circuit 16 are provided to the shift register 42 and the pattern detection circuit 43.

The shift register 42 converts the provided serial channel data into the 8-bit parallel channel data (referred to as the channel data below). The channel data is provided to the demodulation ROM 44 and the first data organizer 51 of the error flag generation circuit 45 as the address data. The channel data (ROM address) is shown in FIG. 4E. For example, since at a time t1, the serial channel data (shown in FIG. 4B) "10000100" has been input to the shift register 42, the channel data (ROM address) is "84".

When the 16-bit resync code of the synchronous signal is detected from the channel data, the pattern detection circuit 43 outputs the resync detection signal shown in FIG. 4C, as described above. The resync detection signal is provided to the second data organizer 52 in the error flag generation circuit 45.

The demodulation ROM 44 outputs the data stored in the address corresponding to the 8-bit channel data from the shift register 42, shown in FIG. 4E, to the effective length counter 46 and the P/S conversion circuit 47, as the ROM output data shown in FIG. 4G.

For example, as shown in FIG. 7A, when "0100****", that is, (40, 41, 42, 43, 44, 45, 46, 47, 48, 49, 4A, 4B, 4C, 4D, 4E, 4F h (hexadecimal)) is provided as address data D7 to D0, as shown in FIG. 8, the demodulation ROM 44 outputs "10000010" (82 h) as the ROM output data. The leftmost column in FIG. 8 shows a ROM address input high-order 4-bit data, and the uppermost row shows a ROM address input low-order 4-bit data.

Furthermore, as shown in FIG. 7B, when "100100", that is, (90, 91, 92, 93 h) is provided as the ROM address data, as shown in FIG. 8C, "01000001" (41 h) is output as the ROM output data. As shown in FIG. 7C, when "00100100", that is, (24 h) is provided, as shown in FIG. 8, "00100000" (20) is output as the ROM output data. As shown in FIG. 7D, when "1000", that is, (80, 81, 82, 83, 84, 85, 86, 87, 88, 89, 8A, 8B, 8C, 8D, BE, 8F h) is provided as the address data, as shown in FIG. 8, "11000010" (C2 h) is output as the ROM output data. As shown in FIG. 7E, when "001000", that is, (20, 21, 22, 23 h) is provided as the address data, "01100001" (61 h) is output as the ROM output data. As shown in FIG. 7F, when "00001000" (08 h) is provided as the address data, as shown in FIG. 8, "00110100" (34 h) is output as the ROM output data. As shown in FIG. 7G, when "000100**", that is, (10, 11, 12, 13 h) is provided as the address data, as shown in FIG. 8, "00000001" (01 h) is output as the ROM output data. The ROM output data is provided to the effective length counter 46 and the P/S (Parallel/Serial) conversion circuit 47.

The effective length counter 46 judges the word boundary of the variable length block code by the 2–7 code modulation. That is, the effective length counter 46 judges whether the channel data length as the 2–7 modulated signal is 4 bits, 6 bits or 8 bits by using the ROM output data low-order 2 bits shown in FIG. 4G, and the effective length counter 46 outputs the word boundary signal shown in FIG. 4F. As shown in FIG. 10, for example, when the low-order 2 bits of the ROM output data (shown in FIGS. 4G and 8) are "00", the word length of the channel data is 8 bits. When the low-order 2 bits are "01", the word length of the channel data is 6 bits. When the low-order 2 bits are "10", the word length of the channel data is 4 bits. According to the judged result, the word boundary signal (an effective length counter load signal) shown in FIG. 4F is output.

For example, at the time t1 shown in FIG. 4E, the ROM address is "84". As shown in FIGS. 8 and 4G, the ROM 44 outputs "C2" as the "84" address input. The effective length counter 46 judges the word length of the channel data to be 4 bits as shown in FIG. 10 from the low-order 2 bits "10" of the "C2". Accordingly, after four channel clocks from the time t1 (at a time t2), the word boundary signal falls (shown in FIG. 4F). Similarly, since at the time t2, the ROM address (shown in FIG. 4E) is "48", the ROM 44 outputs "82" as the ROM output data (shown in FIG. 4G). The effective length counter 46 judges the word length of the channel data to be 4 bits as shown in FIG. 10 from the low-order bits "10" of the "82". Accordingly, after four channel clocks from the time t2 (at a time t3), the word boundary signal is trailed (shown in FIG. 4F).

The P/S conversion circuit 47 judges whether the bit word length of the output demodulated data (user data) is 2 bits, 3 bits or 4 bits by using the low-order 2 bits of the 8-bit ROM output data from the demodulation ROM 44. For example, as shown in FIG. 10, when the ROM output low-order 2 bits (D1, D0) is "00", the word length of the user data is judged to be 4 bits. When (D1, D0) is "01", the word length of the user data is judged to be 3 bits. When (D1, D0) is "10", the word length of the user data is judged to be 2 bits. Thus, the P/S conversion circuit 47 outputs the ROM output data from the demodulation ROM 44 as the serial demodulated data (user-data).

For example, at the time t1 shown in FIG. 4E, when "11000010" (C2 h) is provided to the ROM address (channel data shown in FIG. 4E) "10000100" (84 h) from the demodulation ROM 44, the P/S conversion circuit 47 judges the word length of the user data to be 2 bits from the ROM output low-order 2 bits "10". "11" of the high-order 2 bits is output from the trailing edge of the data clock (shown in FIG. 4H) next to the time t1 (shown in FIG. 4I). The demodulated data is synchronized to the data clock from the effective length counter 46 and it is output.

Furthermore, at the time t2 shown in FIG. 4E, when "10000010" (82 h) is provided to the ROM address "01001000" (48 h) from the demodulation ROM 44, the P/S conversion circuit 47 judges the word length of the user data to be 2 bits from the ROM output low-order 2 bits "10". The high-order 2 bits "10" is output as the demodulated data.

Furthermore, at a time t3 shown in FIG. 4E, when "11000010" (C2 h) is provided to the ROM address "10001000" (88 h) from the demodulation ROM 44, the P/S conversion circuit 47 judges the word length of the user data to be 2 bits from the ROM output low-order 2 bits "10". The high-order 2 bits "11" is output as the demodulated data.

When "01100001" (61 h) is provided to the ROM address "00100000" (20 h) from the demodulation ROM 44, the word length is judged 3 bits from the low-order 2 bits "01". The high-order 3 bits "011" is output as the demodulated data.

When "00110110" (36 h) is provided to the ROM address "00001001" (09 h) from the demodulation ROM 44, the word length of the user data is judged 2 bits from the low-order 2 bits "10". The high-order 2 bits "00" is output as the demodulated data.

When "01000001" (41h) is provided to the ROM address "10010000" (90 h) from the demodulation ROM 44, the word length is judged 3 bits from the low-order 2 bits "01". The high-order 3 bits "010" is output as the demodulated data.

When "00000001" (01 h) is provided to the ROM address "00010000" (10 h) from the demodulation ROM 44, the word length of the user data is judged 3 bits from the low-order 2 bits "01". The high-order 3 bits "000" is output as the demodulated data. The demodulated data from the P/S conversion circuit 47 is provided to the memory 2.

In the memory 2, by the control of the CPU 30, the user data as the demodulated data from the P/S conversion circuit 47 and each error correction code are arranged in the matrix, and they are stored in the memory 2. In the arrangement, a plurality of interleave sequences comprising a predetermined number of data and a predetermined number of error correction code (ECC) are formed. FIG. 14 shows the format of each data and each error correction code in the memory 2.

DS1 to DS3 are data sync codes, and do not enter into the data portion, but they are shown in FIG. 14. "1" to "512" in FIG. 14 denote 1-byte to 512-byte user data. "P1.1" to "P1.4" are the pointer regions where a self-address or the like are recorded.

"CRC1" to "CRC4" (4 bytes) can detect the error of 512-byte user data +4-byte pointer. "E1.1" to "E5.16" are the error correction codes, and 80 bytes are added to the "E1.1" to "E5.16". The error correction codes can correct an error in the vertical direction in FIG. 14.

The vertical column is called the interleave. There are five vertical columns, numbered "0" to "4", where each column is called the interleave "0" or the like. One interleave comprises user data, pointer data, a 104-byte CRC and a 16-byte error correction code for a total of 120 bytes. Furthermore, the resync codes "RS1" to "RS39" are arranged for every 15 bytes data or error correction code.

It is known that the error detection and the error correction ability using the error correction code are 16 bytes per one interleave in case of an erasure correction, and they are 8 bytes per one interleave in case of a non-erasure correction.

Erasive correction means correction of an error whose position is known, but whose error pattern (value) is not known. A non-erasure correction is correction of an error whose position and error pattern are not known. The error position and the error pattern are considered as one unknown number, respectively. If the value is "16" or less, it can be corrected. Accordingly, the above description "16 bytes in case of the erasure correction" means correction of an 16-byte error whose position is known. The above description "8 bytes in case of the non-erasure correction" means correction of an 8-byte error whose error position and error pattern are not known.

For example, it is possible that a 4-byte error is corrected by the non-erasure correction, and an 8-byte error is corrected by the erasure correction. The 4-byte error is expressed as {(the position+the pattern)×4=8}, and the 8-byte error is expressed as {(the pattern)×8=8}, thereby the total unknown number is "16".

As described above, when the address corresponding to the shaded portion in the ROM data for demodulation shown in FIG. 8 is provided, the logic circuit 51a in the first data organizer 51 outputs "1" as the error signal. When the address corresponding to the portion shown by the non-shaded portion is provided, the logic circuit 51a outputs "0". For example, at a time t4 shown in FIG. 5D, the ROM address in FIG. 5D is "09". As shown in FIG. 8, the ROM output data corresponding to the address "09" is the data "36" shown by the shaded portion. Accordingly, the logic circuit 51a outputs a high level as shown in FIG. 5E.

When the error signal from the logic circuit 51a is provided, if the word boundary signal is provided from the effective length counter 46, the flip-flop 51b outputs the 2–7 modulation rule violation error signal to the third data organizer 53. For example, at a time tS, since at the leading edge of the word boundary signal shown in FIG. 5F, the ROM address error signal is the high level, the logic circuit 51a outputs the 2–7 modulation rule violation error signal (high level).

The second data organizer 52 detects whether the resync code is provided at a predetermined time period (15 bytes) by the resync detection signal from the pattern detection circuit 43 and the data clock from the effective length counter 46. When the resync code is not provided at a predetermined time period, the resync is output to the third data organizer 53. For example, at a time t6, when a noise is included in the resync code as shown by a dotted line, the resync detection signal (low level) shown in FIG. 5B is not generated. Accordingly, the second data organizer 52 outputs the resync undetected signal as shown in FIG. 5N.

When the error signal relative to the 3-byte and more 2–7 modulation rule violation is generated for every 5-byte data (1 digit), the third data organizer 53 outputs the error flag relative to the digit. For example, as shown in the shaded portion in FIG. 13, when the error signal relative to the 2–7 modulation rule violation is generated relative to 6, 7 and 8-byte data, or when the error signal is generated relative to 11, 13 and 15-byte data, the third data organizer 53 outputs the error flag relative to the digit numbers "1" and "2". Furthermore, as described below, when the resync undetected codes such as RS2, RS4 and RS5 are generated, similarly, the third data organizer 53 outputs the error flag such as the digit numbers 5, 9, 10, 11, and 14.

In the error correction circuit 32, the content of the interleaved data specified by the error flag signal having the digit number from the third data organizer 53 in each data in the memory 2 is corrected according to the error correction code having the same interleave.

Thus, the error position of the data is specified by the error flag generation circuit 45. As a result, all the error correction codes having 16 bytes in each interleave can be used only for the content (pattern) correction. The erasure correction can be carried out.

Accordingly, without losing the effect of the high density record as the optical disk, further without extending the time necessary for the correction such as multiplexing the error correction code, the error correction function can be enhanced.

Figure 13:
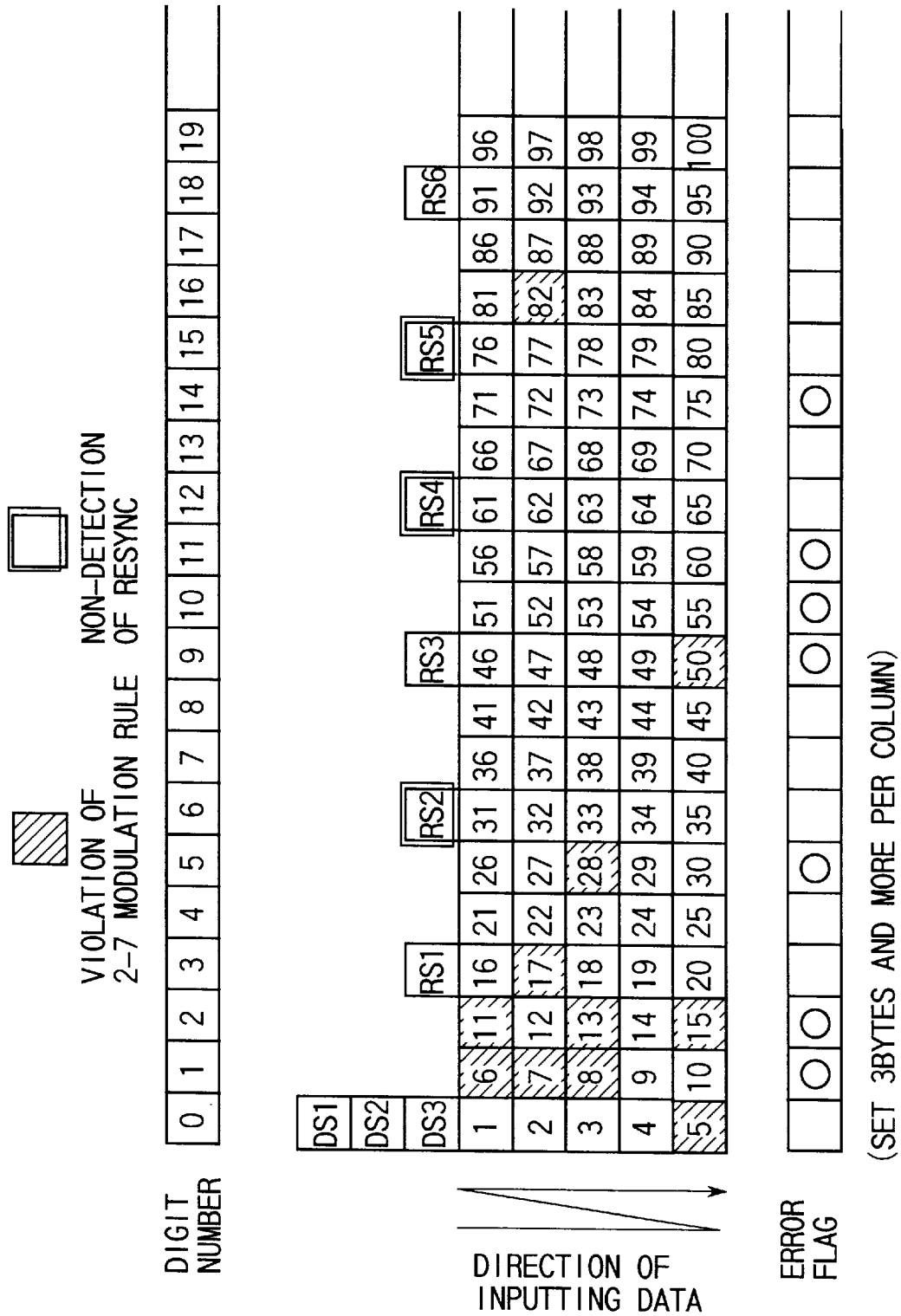
FIG. 13 is a state diagram explaining generation of an error flag at each digit.

Next, when the user data demodulated via the P/S conversion circuit 47 is a state as shown in FIG. 13, the reason the third data organizer 53 outputs the error flag corresponding to the digit numbers 1, 2, 5, 9, 10, 11, and 14 will be explained.

If dust are on the optical disk 1, not only 1-byte data is lost, but also, in many cases, the dust has a bad influence upon the data before and after the dust. Thus, when the error flag generates in three and more bytes in the same digit, for example, when the error signal relative to the 2–7 modulation rule violation generates relative to 6, 7 and 8-byte data, such as the digit numbers "1" and "2" shown in FIG. 13, or when the error signal relative to the 2–7 modulation rule violation generates relative to 11, 13 and 15-byte data, it is judged that the data near these bytes, that is, 9, 10-byte data and 12, 14-byte data are also similarly lost. According to the judgment, the error flag relating to the digit is established.

In this case, the data content (pattern) relative to the digit numbers "1" and "2" is erasure-corrected according to the error correction code (ECC) of each interleave.

On one hand, since the error which cannot be corrected by the 2–7 code conversion rule, there is such an error as a bit missing or the like due to a defect of the optical disk 1. When this error remains generated, the data sequence is entirely different from an original data sequence itself.

The resync codes "RS1" to "RS39" set for every 15 byte of each data and each error correction code are detected in the pattern detection circuit 43, and according to whether the resync detection signal from the pattern detection circuit 43 exists or not, it is judged that the resync code is undetected.

For example, between the resync detection window output after a predetermined time period from the detection of the resync code "RS1", when the resync code is not detected, it is judged that the resync code "RS2" is undetected. When it is judged that the resync code is undetected, since the error signal relative to the 2–7 modulation rule violation generates relative to a 28-byte data, the error flag relative to the digit number "5" is output.

In this case, all the data contents relative to the digit number "5" can be erasure-corrected according to the error correction code of each interleave.

Furthermore, between the resync detection window output after a predetermined time period from the detection of the resync code "RS3", when the resync code is not detected, it is judged that the resync code "RS4" is undetected. When it is judged that the resync code is undetected, since the error signal relative to the 2–7 modulation rule violation generates relative to a 50-byte data, the error flag relative to the digit number "9", "10" and "11" is output.

In this case, all the data contents (patterns) relative to the digit numbers "9", "10" and "11" can be erasure-corrected according to the error correction code of each interleave.

Furthermore, between the resync detection window output after a predetermined time period from the detection of the resync code "RS4", when the resync code is not detected, it is judged that the resync code "RS5" is undetected. In this case, since the error signal relative to the 2–7 modulation rule violation does not generate, the error flag relative to the digit number "14" just before the undetected resync code "RS5" is output.

In this case, all the data contents (patterns) relative to the digit number "14" can be erasure-corrected according to the error correction code of each interleave.

Thus, the error relating the data sequence can be corrected, thereby aside from the correction according to the 2–7 code conversion rule, the error correction ability can be enhanced.

According to the above present invention, the data organizer (the first data organizer to the third data organizer) which specify the error position of the data are disposed, and the error correction code is constructed so that it is used for only the pattern correction. Accordingly, without losing the effect of the high density record or extending the time necessary for the correction, the error correction ability is enhanced.

According to the above embodiment, the example using the 2–7 code conversion is explained. However, other code conversions, such as a 1–7 code version can be applied to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An information processing apparatus for reading information recorded in information storage media, comprising:
    a converter which extracts a serial analog reproduced signal including data and an error code from said information storage media, and which converts said reproduced signal into a plurality of data sequences having a predetermined length, said converter including a binary circuit which digitizes said analog signal and which provides binary data, and a shift register which converts said binary data into parallel data having said predetermined length;
    a comparator which judges whether a data pattern of said data sequences converted by said converter is included in a plurality of previously determined data patterns or not, and if not, which judges said data sequences as an error data sequence, said comparator including a selector which selects effective data in said parallel data having said predetermined length converted by said shift register and which provides said effective data as said data sequence having said predetermined length;
    a data organizer which arranges a predetermined number of said data sequences converted by said converter in a matrix and which specifies a position in said matrix of said error data sequence judged by said comparator; and
    an error corrector which corrects said error data sequence in said data sequences arranged in said matrix by using said position of said error data sequence specified by said data organizer and said error code.

2. An information processing apparatus for reading information recorded in information storage media, comprising:
    a converter which extracts a reproduced signal from said information storage media and which converts said reproduced signal into a plurality of data sequences having a predetermined length, said reproduced signal including data, an error code, and a resync code set at every predetermined distance;
    a first comparator which judges whether a data pattern of said data sequences converted by said converter is included in a plurality of previously determined data patterns or not, and if not, which judges said data sequences as an error data sequence;
    a second comparator which judges whether said resync code is included in said data sequence converted by said converter at said every predetermined distance or not, and if not, which adds a resync code error flag to said data sequence;
    a data organizer which arranges a predetermined number of said data sequences converted by said converter in a matrix and which specifies a position in said matrix of said error data sequence judged by said comparator; and
    an error corrector which corrects said error data sequence in said data sequences arranged in said matrix by using said position of said error data sequence specified by said data organizer and said error code, said error corrector correcting said error data sequence by using said resync code error flag added to said data sequence by said second comparator.

3. An information processing apparatus for reading an information recorded in information storage media, comprising:
    a converter which extracts a modulated reproduced signal including data, an error code, and a resync code set at a predetermined distance from said information storage media and which converts said reproduced signal into a plurality of data sequences having a predetermined length;
    a demodulator which demodulates said data sequence converted by said converter in accordance with a predetermined rule;
    a first comparator which judges whether said data sequence converted by said converter is an applicable data sequence to said predetermined rule or not, and if not, which adds a rule violation error flag to said data sequence;
    a second comparator which judges whether said resync code is included in said data sequence demodulated by said demodulator at said predetermined distance or not, and if not, which adds said resync code error flag to said data sequence; and
    an error corrector which arranges a predetermined number of said data sequences converted by said converter in a matrix and which corrects an error in said predetermined number of data sequences by using said rule violation error flag, said error code, and said resync code error flag.

4. The apparatus according to claim 3, wherein
said reproduced signal is a serial analog signal;
said converter includes a binary circuit which digitizes said analog signal and which provides binary data, and a shift register which converts said binary data into parallel data having said predetermined length and which provides said parallel data as said data sequence having said predetermined length; and
said first comparator includes a selector which selects effective data in said parallel data having said predetermined length converted by said shift register and which provides said effective data as said data sequence having said predetermined length.

5. The apparatus according to claim 3, wherein:
said demodulator includes a demodulation ROM which inputs said data sequence as an address and which provides data stored in said address as demodulated data; and
said apparatus further comprises:
a third comparator which judges an effective length of said demodulated data, and
    an output circuit which selectively outputs data judged to be effective from said demodulated data by said third comparator.

6. An information processing apparatus for reading an information recorded in information storage media, comprising:

- a converter which extracts a reproduced signal including data, an error code, and a resync code set at a predetermined distance from said information storage media and which converts said reproduced signal into a plurality of data sequences having a predetermined length;
- a demodulator which demodulates said data sequences converted by said converter in accordance with a predetermined rule;
- a first comparator which judges whether said data sequences converted by said converter is an applicable data sequence to said predetermined rule or an inapplicable error data;
- a second comparator which judges whether said resync code is included in said data sequences converted by said converter at said predetermined distance or not, and if not, which adds a resync code undetected position in said plurality of data sequences having said predetermined length;
- a data organizer which arranges a predetermined number of said data sequences demodulated by said demodulator in a matrix comprising rows and columns;
- a third comparator which judges an error column in which all data are estimated to be an error value in said columns of said matrix by using a position in said matrix of said data sequence judged to be error data by said first comparator and said resync code undetected position judged by said second comparator, and which sets an error flag relative to said error column; and
- an error corrector which estimates all the data included in said error column where said error flag is set by said third comparator as said error value, and which corrects an error in a direction of said row of said matrix by using said error code.

7. The apparatus according to claim 6, wherein said third comparator judges an error row in which all data are estimated to be an error value in said rows of said matrix by using said position in said matrix of said data sequence judged to be error data by said first comparator and said resync code undetected position judged by said second comparator, and which sets said error flag relative to said error row; and

- said error corrector includes an estimator which estimates all data included in said error row where said error flag is set by said third comparator as said error value, and which corrects an error in a direction of said column of said matrix by using said error code.

8. The apparatus according to claim 6, wherein said reproduced signal is a serial analog signal;

said converter includes a binary circuit which digitizes said analog signal and which provides binary data, and a shift register which converts said binary data into parallel data having said predetermined length and which provides said parallel data as said data sequence having said predetermined length; and said first comparator includes a selector which selects effective data in said parallel data having said predetermined length converted by said shift register and which provides as said data sequence having said predetermined length.

9. The apparatus according to claim 6, wherein:

said demodulator includes a demodulation ROM which inputs said data sequence as an address and which provides data stored in said address as demodulated data; and said apparatus further comprises:
- a third comparator which judges an effective length of said demodulated data, and
- an output circuit which selectively outputs said data judged to be effective from said demodulated data by said third comparator.

* * * * *